(12) United States Patent
Fukunaka (10) Patent No.: US 10,867,894 B2
(45) Date of Patent: Dec. 15, 2020

(54) SEMICONDUCTOR ELEMENT INCLUDING ENCAPSULATED LEAD FRAMES

(71) Applicant: ASAHI KASEI MICRODEVICES CORPORATION, Tokyo (JP)

(72) Inventor: Toshiaki Fukunaka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/571,502

(22) Filed: Sep. 16, 2019

(65) Prior Publication Data

US 2020/0118911 A1 Apr. 16, 2020

(30) Foreign Application Priority Data

Oct. 11, 2018 (JP) ................................. 2018-192523
Aug. 13, 2019 (JP) ................................. 2019-148537

(51) Int. Cl.
*H01L 23/495* (2006.01)
*H01L 23/31* (2006.01)

(52) U.S. Cl.
CPC .... *H01L 23/49537* (2013.01); *H01L 23/3107* (2013.01)

(58) Field of Classification Search
CPC ........... H01L 23/49537; H01L 23/3107; H01L 2224/97; H01L 21/561; H01L 31/02; H01L 23/49562

See application file for complete search history.

(56) References Cited

U.S. PATENT DOCUMENTS 5,446,313 A * 8/1995 Masuda ............ H01L 23/49555
257/666
5,508,232 A * 4/1996 Ueda ..................... H01L 21/565
29/827

(Continued)

FOREIGN PATENT DOCUMENTS

JP 2006-049372 A 2/2006
JP 3130684 U 3/2007

(Continued)

*Primary Examiner* — John P. Dulka
(74) *Attorney, Agent, or Firm* — Morgan, Lewis & Bockius LLP (57) ABSTRACT

To achieve the miniaturization of and the enhancement of the strength of a semiconductor element. In a semiconductor element (1) having a shape of a rectangular parallelepiped, on four sides forming one surface of the rectangular parallelepiped in plan view, portions of at least one of a first lead frame (11) and a second lead frame (12) are respectively in contact with the four sides and are exposed from a sealing portion (4) to serve as connection terminals (P12, P14, N11, N14), and in each of two pairs each composed of the two sides, facing each other, of the four sides, the portion of the first lead frame (11) is in contact with one of the two sides and is exposed as the connection terminal (P12, P14), the portion of the second lead frame (12) is in contact with the other of the two sides and is exposed as the connection terminal (N11, N14), and the connection terminal (P12, P14) formed by the first lead frame (11) and the connection terminal (N11, N14) formed by the second lead frame (12) are disposed at positions that are axially symmetric with each other.

20 Claims, 8 Drawing Sheets

(56) References Cited

U.S. PATENT DOCUMENTS

| | | | | |
|---|---|---|---|---|
| 5,977,613 | A * | 11/1999 | Takata | H01L 21/565 257/666 |
| 6,130,473 | A * | 10/2000 | Mostafazadeh | H01L 21/561 257/666 |
| 7,049,177 | B1 * | 5/2006 | Fan | H01L 21/4832 257/676 |
| 7,342,297 | B1 * | 3/2008 | Tan | H01L 21/561 257/666 |
| 7,763,958 | B1 * | 7/2010 | Lim | H01L 23/3107 257/666 |
| 7,816,778 | B2 * | 10/2010 | Lee | H01L 23/5387 257/688 |
| 7,838,339 | B2 * | 11/2010 | Tsui | H01L 24/49 438/123 |
| 8,174,099 | B2 * | 5/2012 | Lam | H01L 23/49548 257/676 |
| 8,247,888 | B2 * | 8/2012 | Masuda | H01L 23/16 257/659 |
| 8,519,551 | B2 * | 8/2013 | Osajima | H01L 27/0203 257/786 |
| 9,000,570 | B2 * | 4/2015 | Chan | H01L 23/49541 257/670 |
| 9,627,305 | B2 * | 4/2017 | Meyer-Berg | H01L 24/81 |
| 10,115,660 | B2 * | 10/2018 | Lee | H01L 23/49541 |
| 10,784,190 | B2 * | 9/2020 | Lee | H01L 23/49541 |
| 2002/0079561 | A1 * | 6/2002 | Yasunaga | H01L 24/97 257/670 |
| 2003/0127711 | A1 * | 7/2003 | Kawai | H01L 21/565 257/666 |
| 2004/0157372 | A1 * | 8/2004 | Manatad | H01L 24/40 438/108 |
| 2004/0232541 | A1 * | 11/2004 | Son | H01L 23/3107 257/696 |
| 2007/0170600 | A1 * | 7/2007 | Nishimura | H01L 24/32 257/784 |
| 2008/0151557 | A1 | 6/2008 | Su et al. | |
| 2009/0026590 | A1 * | 1/2009 | Lim | H01L 24/97 257/670 |
| 2012/0120668 | A1 | 5/2012 | Su et al. | |
| 2013/0334672 | A1 * | 12/2013 | Denta | H01L 21/50 257/666 |
| 2014/0191381 | A1 * | 7/2014 | Lee | H01L 23/49575 257/676 |
| 2016/0013377 | A1 | 1/2016 | Ozeki et al. | |
| 2017/0222131 | A1 * | 8/2017 | Chew | H01L 43/04 |
| 2017/0345742 | A1 * | 11/2017 | Sakamoto | H01L 23/4952 |
| 2018/0190574 | A1 * | 7/2018 | Huang | H01L 23/49541 |
| 2019/0295932 | A1 * | 9/2019 | Nakata | H01L 23/48 |
| 2020/0091042 | A1 * | 3/2020 | Kadoguchi | H01L 23/49562 |
| 2020/0118911 | A1 * | 4/2020 | Fukunaka | H01L 23/3107 |
| 2020/0235043 | A1 * | 7/2020 | Milo | H01L 23/49524 |
| 2020/0273781 | A1 * | 8/2020 | Scharf | H01L 23/49537 |
| 2020/0273790 | A1 * | 8/2020 | Tay | H01L 21/4846 |

FOREIGN PATENT DOCUMENTS

| | | |
|---|---|---|
| JP | 2014-146763 A | 8/2014 |
| JP | 2015-015406 A | 1/2015 |
| JP | 2016-019001 A | 2/2016 |

\* cited by examiner

SEMICONDUCTOR ELEMENT INCLUDING ENCAPSULATED LEAD FRAMES

BACKGROUND OF THE INVENTION

Field of the Invention

The present invention relates to a semiconductor element.

Description of the Related Art

In terms of the efficiency in the manufacture of semiconductor devices, there has conventionally been used a large lead frame substrate that is formed with a plurality of regions for placement of semiconductor chips. The semiconductor chips are respectively mounted in those regions of the lead frame substrate, then the lead frame substrate mounted with the semiconductor chips is molded as a whole, and then the molded lead frame substrate is cut into individual pieces using a cutting machine or the like, thereby obtaining a plurality of semiconductor devices (see, e.g. PTL 1).

CITATION LIST

Patent Literature

PTL 1: JP 2006-49372 A

SUMMARY OF THE INVENTION

In recent years, with the miniaturization and multi-functionalization of electronic devices, semiconductor devices that are mounted in the electronic devices have been miniaturized, and with the miniaturization of the semiconductor devices, there is room for improvement in terms of the strength of the semiconductor devices.

In view of this, the present invention has been made taking into account the conventional unsolved problem described above and has an object to provide a semiconductor element that can achieve both the miniaturization and the enhancement of the strength.

In order to achieve the above object, a semiconductor element according to one aspect of the present invention includes: a semiconductor substrate; a compound semiconductor layer formed on the semiconductor substrate and including a first conductivity type semiconductor layer, an active layer, and a second conductivity type semiconductor layer; a first electrode electrically connected to the first conductivity type semiconductor layer; a second electrode electrically connected to the second conductivity type semiconductor layer; a first lead frame electrically connected to the first electrode; a second lead frame electrically connected to the second electrode; and a sealing portion integrally sealing the semiconductor substrate, the compound semiconductor layer, the first electrode, the second electrode, the first lead frame, and the second lead frame. The semiconductor element has a shape of a rectangular parallelepiped and has a photoelectric conversion function or an electro-optical conversion function. On four sides forming one surface of the rectangular parallelepiped in plan view, portions of at least one of the first lead frame and the second lead frame are respectively in contact with the four sides and are exposed from the sealing portion to serve as connection terminals, and in each of two pairs each including the two sides, facing each other, of the four sides, the portion of the first lead frame is in contact with one of the two sides and is exposed as the connection terminal, the portion of the second lead frame is in contact with the other of the two sides and is exposed as the connection terminal, and the connection terminal being the exposed portion of the first lead frame and the connection terminal being the exposed portion of the second lead frame are disposed at positions that are axially symmetric with each other.

According to the aspect of the present invention, it is possible to achieve the miniaturization of and the enhancement of the strength of the semiconductor element.

BRIEF DESCRIPTION OF THE DRAWINGS

FIGS. 8A, 8B, and 8C illustrate one example of a semiconductor element manufactured using the lead frame substrate of FIG. 7, wherein FIG. 8A is a bottom view, FIG. 8B is a side view, and FIG. 8C is a plan view.

DESCRIPTION OF THE PREFERRED EMBODIMENTS

In the following detailed description, many particular specific configurations will be described to provide a complete understanding of embodiments of the present invention. It will be apparent, however, that other embodiments can be implemented without being limited to such particular specific configurations. In addition, the following embodiments do not limit the invention according to the claims and include all the combinations of characteristic configurations described in the embodiments.

Hereinafter, the embodiments of the present invention will be described with reference to the drawings. In the following description of the drawings, the same symbols will be assigned to the same portions. It is to be noted, however, that the drawings are only schematic and therefore the relationship between the thickness and the planar dimensions, the ratio of the thicknesses of respective layers, and so on differ from actual ones.

Figure 1:
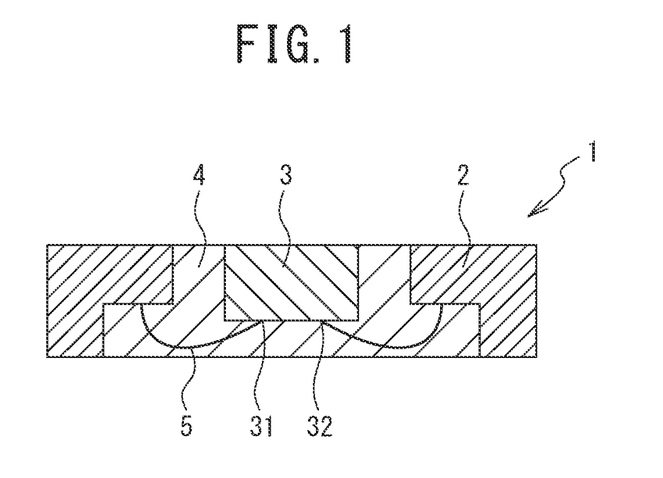
FIG. 1 is a sectional view illustrating one example of a semiconductor element according to an embodiment of the present invention.

FIG. 1 is a longitudinal sectional view illustrating a schematic configuration of one example of a semiconductor element 1 according to one embodiment of the present invention.

The semiconductor element 1 is an element having a photoelectric conversion function or an electro-optical conversion function and configured to receive or emit light. The semiconductor element 1 includes a lead frame 2, an IR chip 3, and a sealing portion 4 that integrally seals the lead frame 2 and the IR chip 3. The IR chip 3 and the lead frame 2 are electrically connected to each other by wires 5.

The IR chip 3 is composed of, for example, infrared sensors or light-emitting diodes. Like the known IR chip, the IR chip 3 includes, for example, a semiconductor substrate, a compound semiconductor layer formed on the semiconductor substrate and including a first conductivity type semiconductor layer, an active layer, and a second conductivity type semiconductor layer, a first electrode 31 electrically connected to the first conductivity type semiconductor layer, and a second electrode 32 electrically connected to the second conductivity type semiconductor layer.

Semiconductor elements 1 are manufactured, for example, by the known process that fills a sealing material into a mold to seal an object. Specifically, first, a later-described lead frame substrate 6 that is formed with a plurality of element formation regions and will be divided into lead frames 2 later is bonded to an adhesive sheet. Then, IR chips 3 are respectively bonded to regions on the adhesive sheet corresponding to the element formation regions of the lead frame substrate 6, and then the lead frame substrate 6 and electrodes 31, 32 of the IR chips 3 are electrically connected to each other by wires 5. Then, a sealing material such as a material containing a thermosetting epoxy resin is filled into a mold to integrally seal the lead frame substrate 6, the IR chips 3, and the wires 5. Then, the semiconductor elements 1 integrally formed including the lead frame substrate 6 are divided into individual pieces so that the individual semiconductor elements 1 each having a rectangular parallelepiped outer shape are formed.

Figure 2:
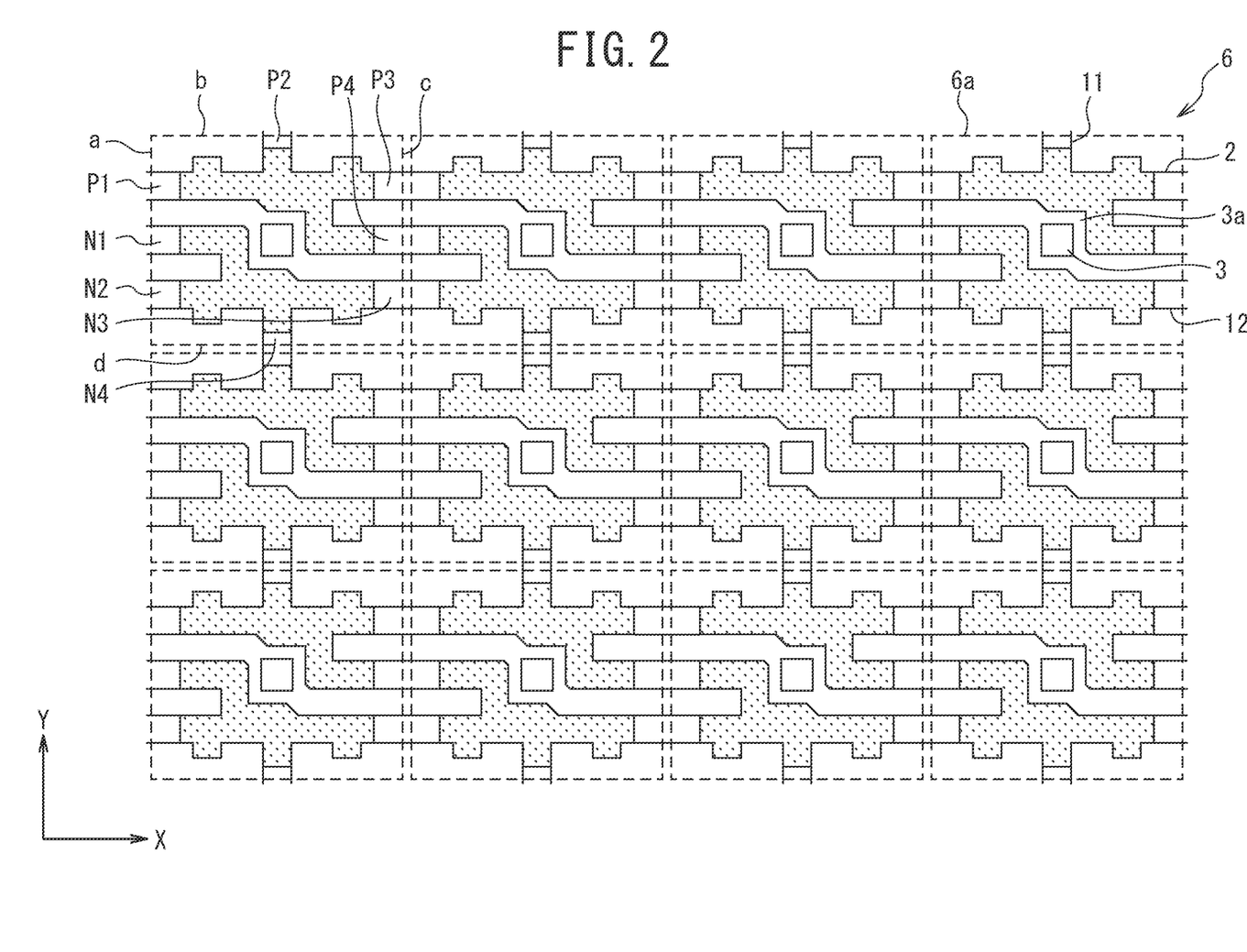
FIG. 2 is a plan view illustrating one example of a lead frame substrate.

FIG. 2 is a plan view illustrating one example of the lead frame substrate 6.

As illustrated in FIG. 2, the lead frame substrate 6 is formed such that a plurality of members that will respectively serve as the lead frames 2 of the semiconductor elements 1 when the lead frame substrate 6 is divided later are connected in a matrix. In FIG. 2, a rectangular region (hereinafter referred to as an "element region") 6a surrounded by a broken line is a region that forms each of the semiconductor elements 1.

As illustrated in FIG. 2, the lead frame 2 includes a first lead frame 11 electrically connected to the first electrode 31 of the IR chip 3 and a second lead frame 12 electrically connected to the second electrode 32 of the IR chip 3. The first lead frame 11 and the second lead frame 12 are disposed to surround a chip mounting region 3a serving as a region in which the IR chip 3 is mounted. Note that in FIG. 2, hatched portions of the first lead frame 11 and the second lead frame 12 are portions that are less in thickness than later-described terminal portions of the first lead frame 11 and the second lead frame 12.

In FIG. 2, the direction in which the element region 6a extends left and right is defined as an X-axis direction, and the direction in which the element region 6a extends up and down is defined as a Y-axis direction. Further, the sides of the rectangular element region 6a are respectively defined as a side a, a side b, a side c, and a side d.

The first lead frame 11 has a terminal portion P1 that protrudes toward the side a and reaches the side a to serve as a connection terminal, a terminal portion P2 that protrudes toward the side b and reaches the side b to serve as a connection terminal, and terminal portions P3, P4 that respectively protrude toward the side c and reach the side c to serve as connection terminals. The terminal portions P1 to P4 are formed integrally with each other. Herein, the connection terminal represents a portion in which the first lead frame 11 is exposed from the sealing portion 4. Naturally, it is not necessary that all connection terminals in the present invention be electrically connected to external terminals. Further, at least a part of the connection terminal may have a shape and thickness so as to be exposed only at a side surface of the sealing portion 4 (i.e. is not necessarily exposed at an upper surface or a lower surface of the sealing portion 4). The same applies to connection terminals of the second lead frame 12.

The second lead frame 12 has terminal portions N1, N2 that respectively protrude toward the side a and reach the side a to serve as connection terminals, a terminal portion N3 that protrudes toward the side c and reaches the side c to serve as a connection terminal, and a terminal portion N4 that protrudes toward the side d and reaches the side d to serve as a connection terminal. The terminal portions N1 to N4 are formed integrally with each other.

The terminal portions P1, N1, N2 and the terminal portions P3, P4, N3 are disposed at positions that are axially symmetric with respect to a segment connecting between the middle point of the side b and the middle point of the side d. The terminal portion P2 and the terminal portion N4 are disposed at positions that are axially symmetric with respect to a segment connecting between the middle point of the side a and the middle point of the side c.

Figure 3:
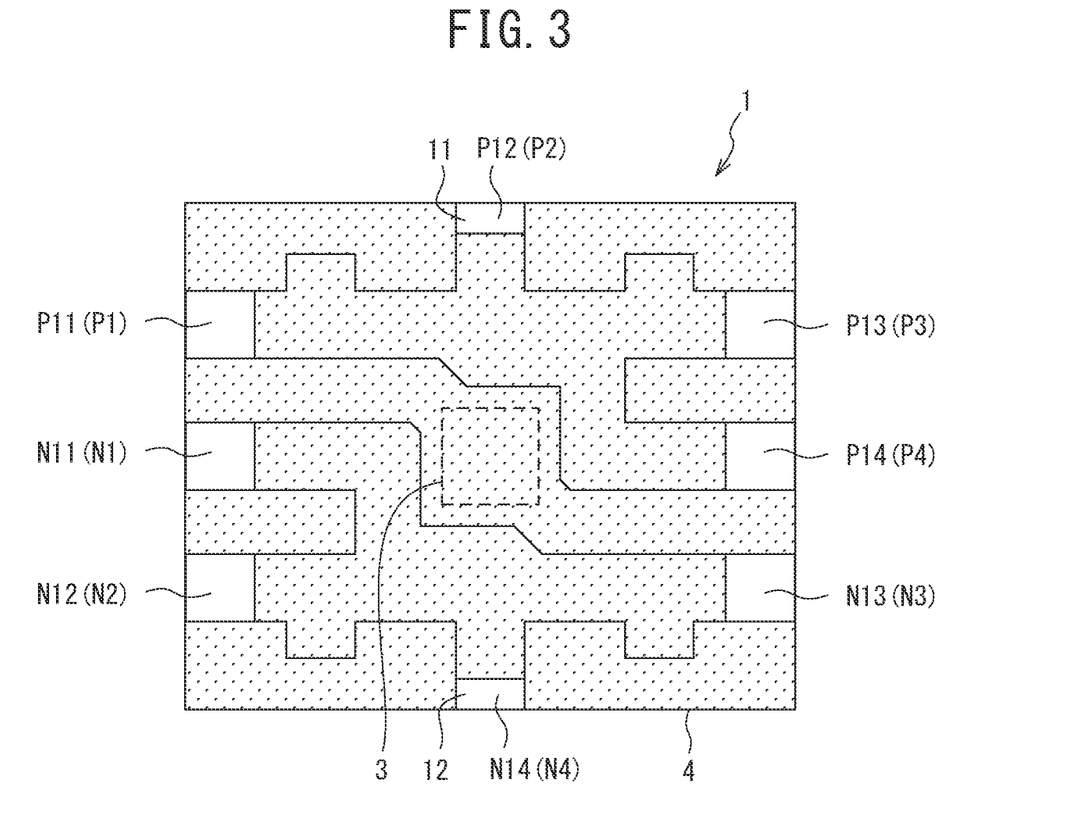
FIG. 3 is one example of a bottom view of the semiconductor element.

When the semiconductor elements 1 are manufactured using the lead frame substrate 6 thus configured, a bottom view of the semiconductor element 1 becomes as illustrated in FIG. 3. That is, the terminal portions P1 to P4 of the first lead frame 11 are exposed from the sealing portion 4 to serve as connection terminals P11 to P14. The terminal portions N1 to N4 of the second lead frame 12 are exposed from the sealing portion 4 to serve as connection terminals N11 to N14. Note that a hatched portion indicates the sealing portion 4 in the bottom view of FIG. 3. In FIG. 3, portions covered by the sealing portion 4 are also drawn by a solid line.

Herein, as illustrated in FIG. 2, since the terminal portions P1 to P4 are disposed on the adjacent sides a to c, the first lead frame 11 is disposed along the sides a to c. Likewise, since the terminal portions N1 to N4 are disposed on the adjacent sides a, d, c, the second lead frame 12 is disposed along the sides a, d, c. That is, in the semiconductor element 1 formed by using the lead frame 2 thus configured, the first lead frame 11 or the second lead frame 12 is present at each of four corners in plan view. Therefore, even when a force is applied to the semiconductor element 1 in a direction to bend the semiconductor element 1 about a diagonal of the semiconductor element 1 in plan view or even when a force is applied to the semiconductor element 1 to bring its corners close to each other in a direction along the diagonal, it is possible to suppress the deformation of the semiconductor element 1, and as a result, it is possible to suppress the application of an external force to the IR chip 3.

In the case where the lead frame substrate 6 is manufactured such that the lead frames 2 each having the arrangement of the terminal portions as illustrated in FIG. 2 are arranged in a matrix, the two lead frames 2 adjacent to each other in the up-down direction (Y-axis direction in FIG. 2) may be connected to each other using the one terminal portion of each lead frame 2, and the two lead frames 2 adjacent to each other in the left-right direction (X-axis direction in FIG. 2) may be connected to each other using the three terminal portions of each lead frame 2. That is, using the terminal portions, the upper and lower lead frames 2 can be connected to each other, and the left and right lead frames 2 can be connected to each other. Therefore, it is not necessary that the terminal portions respectively disposed on the sides a to d between the lead frames 2 be connected to each other by providing connecting bars or the like, so that it is possible to increase correspondingly the number of the lead frames 2 that are cut out of the single lead frame substrate 6.

Further, since the upper and lower and the left and right lead frames 2 can be connected to each other by connecting the terminal portions to each other with the thickness of the terminal portions being kept as it is, it is possible to use a blade with a relatively narrow width as a blade for use in cutting between the lead frames 2. Therefore, it is possible to narrow a region that should be provided between the lead frames 2 to facilitate cutting between the lead frames 2. As a result, it is possible to increase the number of the lead frames 2 that are cut out of the single lead frame substrate 6.

In the above-described embodiment, as illustrated in FIG. 2, the lead frame substrate 6 is configured such that, of the terminal portions P1 to P4 formed by the first lead frame 11, one is provided on the side a of the element region 6a, one on the side b, and two on the side c and that, of the terminal portions N1 to N4 formed by the second lead frame 12, two are provided on the side a of the element region 6a, one on the side d, and one on the side c. Accordingly, the three terminal portions are provided in each of the left and right parts of the element region 6a, and the one terminal portion is provided in each of the upper and lower parts of the element region 6a. However, the present invention is not limited thereto.

Figure 4:
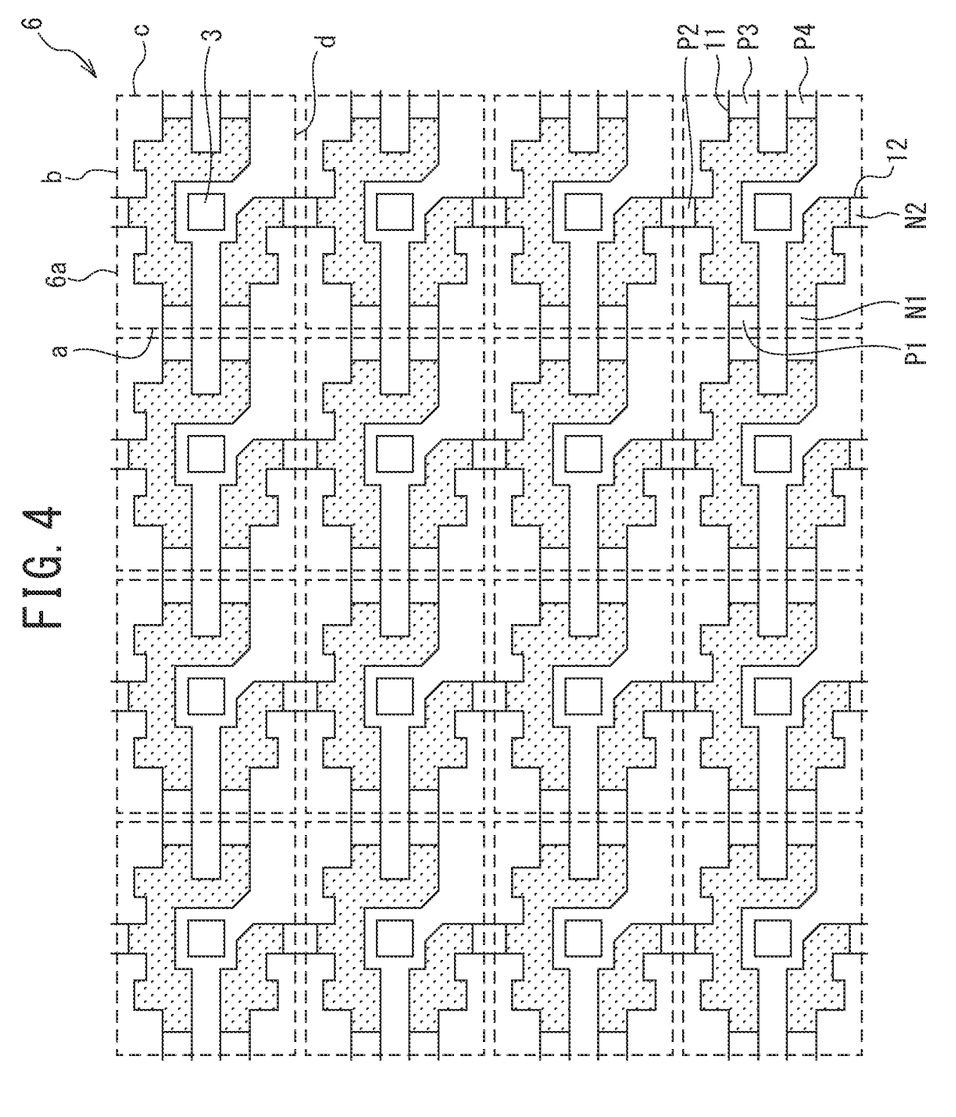
FIG. 4 is a plan view illustrating another example of a lead frame substrate.

For example, as illustrated in FIG. 4, of terminal portions P1 to P4 formed by a first lead frame 11, one may be provided on the side a of the element region 6a, one on the side b, and two on the side c, and, of terminal portions N1, N2 formed by a second lead frame 12, one may be provided on the side a of the element region 6a, and one on the side d. Consequently, the two terminal portions may be provided in each of the left and right parts of the element region 6a, and the one terminal portion may be provided in each of the upper and lower parts of the element region 6a.

Figure 5:
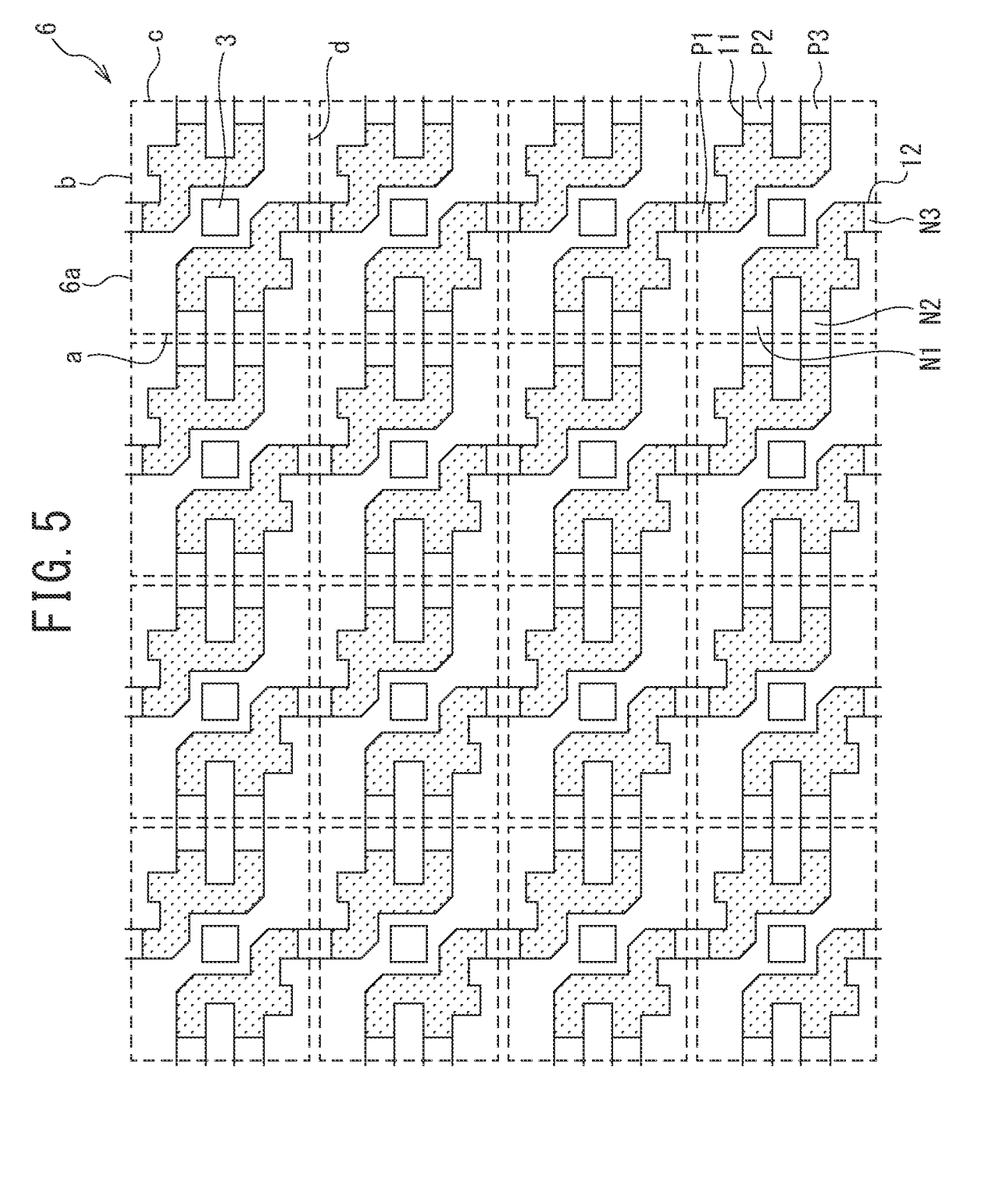
FIG. 5 is a plan view illustrating another example of a lead frame substrate.

For example, as illustrated in FIG. 5, of terminal portions P1 to P3 formed by a first lead frame 11, one may be provided on the side b of the element region 6a, and two on the side c, and, of terminal portions N1 to N3 formed by a second lead frame 12, two may be provided on the side a of the element region 6a, and one on the side d. Consequently, the two terminal portions may be provided in each of the left and right parts of the element region 6a, and the one terminal portion may be provided in each of the upper and lower parts of the element region 6a. In FIGS. 4 and 5, hatched portions indicate portions that are less in thickness than the terminal portions.

When the lead frame 2 has the shape illustrated in FIG. 4 or 5, the first lead frame 11 and the second lead frame 12 are disposed on a diagonal passing through a corner formed by the side b and the side c of the element region 6a and a corner formed by the side a and the side d of the element region 6a. Therefore, at least, even when a force is applied to the semiconductor element 1 in a direction to bend the element region 6a about this diagonal or even when a force is applied to the semiconductor element 1 to bring its corners close to each other in a direction along the diagonal, it is possible to suppress the deformation of the semiconductor element 1. That is, as illustrated in FIGS. 4 and 5, by disposing the first lead frame 11 and the second lead frame 12 so as to overlap either one of the two diagonals of the element region 6a in plan view, it is possible to suppress cracking of the semiconductor element 1 when a force is applied in a direction to bend the semiconductor element 1 about the diagonal, and to suppress the deformation of the semiconductor element 1 itself that occurs when a force is applied in a direction so that the two corners through which the diagonal passes approach each other along the diagonal.

Further, as illustrated in FIG. 2, by disposing the first lead frame 11 and the second lead frame 12 so that the two diagonals and the first and second lead frames 11, 12 overlap each other in plan view, it is possible to further suppress the deformation of the semiconductor element 1 against a force applied to the semiconductor element 1 from the outside.

Likewise, when the lead frame 2 has the shape illustrated in FIG. 2, 4, or 5, the first lead frame 11 or the second lead frame 12 is disposed on a line connecting between the middle point of the side a and the middle point of the side c of the element region 6a. Therefore, at least, even when a force is applied to the semiconductor element 1 in a direction to bend the element region 6a about the line connecting between the middle points of the side a and the side c or even when a force is applied to the semiconductor element 1 so that the side b and the side d approach each other, it is possible to suppress the deformation of the semiconductor element 1. That is, as illustrated in FIGS. 2, 4, and 5, the first lead frame 11 or the second lead frame 12 is disposed so as to overlap the line connecting between the middle point of the side a and the middle point of the side c of the element region 6a or a line connecting between the middle point of the side b and the middle point of the side d of the element region 6a in plan view. Therefore, it is possible to suppress cracking of the semiconductor element 1 when a force is applied in a direction to bend the semiconductor element 1 about the line connecting between the middle point of the side a and the middle point of the side c or the line connecting between the middle point of the side b and the middle point of the side d, and to suppress the deformation of the semiconductor element 1 itself that occurs when a force is applied in a direction so that the side b and the side d or the side a and the side c approach each other along the line between their middle points.

In particular, since a force tends to be applied in a direction to bend the semiconductor element 1 about the diagonal of the semiconductor element 1 in plan view, it is possible to efficiently suppress the deformation of the semiconductor element 1 by an external force.

Figure 6:
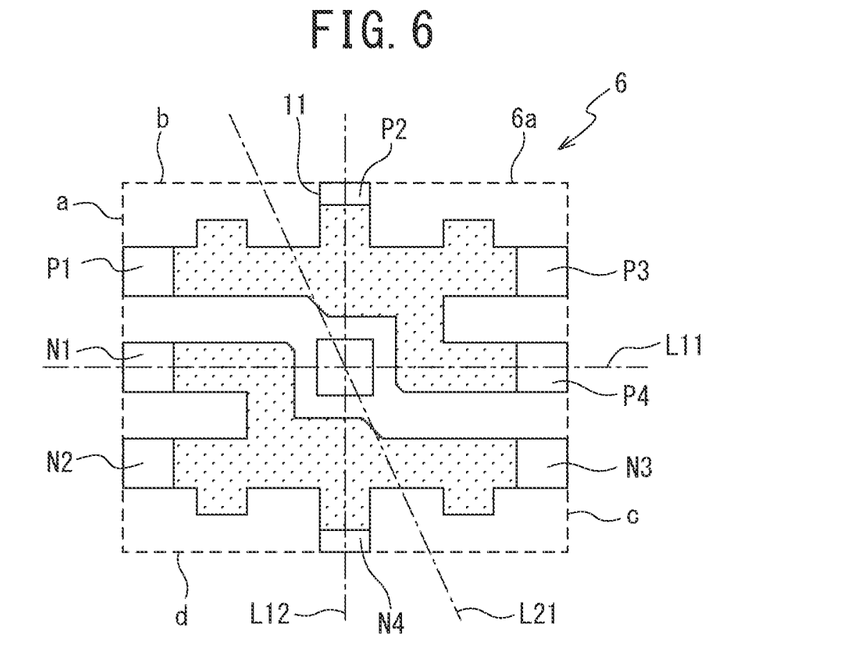
FIG. 6 is an explanatory diagram for explaining arrangement positions of a first lead frame and a second lead frame.

Preferably, as illustrated in FIG. 6, at least one of the first lead frame 11 and the second lead frame 12 is disposed at positions respectively overlapping straight lines L11, L12 each passing through the middle points of the two sides, facing each other, of the four sides a to d of the element region 6a. With this arrangement, when a force is applied in a direction, other than the direction along the diagonal, to bend the semiconductor element 1 about the straight line L11, L12 passing through the middle points of the facing two sides of the semiconductor element 1, or in a direction so that the facing sides of the semiconductor element 1 approach each other in a direction along the straight line L11, L12, it is possible to suppress the deformation of the semiconductor element 1.

Preferably, as illustrated in FIG. 6, at least one of the first lead frame 11 and the second lead frame 12 is disposed, in plan view, at a position overlapping a straight line L21 that divides the semiconductor element 1 into two regions that are point-symmetric with each other. With this arrangement, it is possible to further suppress the deformation of the semiconductor element 1 by a force applied to the semiconductor element 1 from the outside. In FIG. 6, hatched portions indicate portions that are less in thickness than the terminal portions.

In the above-described embodiments, as illustrated in FIGS. 2, 4, and 5, the two or three terminal portions P, N are provided on each of the left and right sides of the element region 6a, and the one terminal portion P, N is provided on each of the upper and lower sides of the element region 6a, but not limited thereto.

If it is satisfied that at least one of terminal portions P formed by a first lead frame 11 and terminal portions N formed by a second lead frame 12 is disposed on each of the sides a to d of the element region 6a, that, in each of two pairs each composed of the facing two sides of the sides a to d, the terminal portion P formed by the first lead frame 11 is disposed on one of the facing two sides and the terminal portion N formed by the second lead frame 12 is disposed on the other side, and that the terminal portion P and the terminal portion N in each of the two pairs are disposed at positions that are axially symmetric with each other, there is no limitation to the number of the terminal portions disposed on each of the left and right sides of the element region 6a and to the number of the terminal portions disposed on each of the upper and lower sides of the element region 6a. That is, for example, in FIG. 2, it is satisfactory if at least the terminal portions P2, P4 and the terminal portions N1, N4 are disposed, and as long as having the terminal portions P2, P4, N1, N4 in such a relationship, a plurality of terminal portions may be provided on each of the sides a to d, and the numbers of the terminal portions on the left and right sides or on the upper and lower sides are not necessarily the same.

It is satisfactory if the terminal portion P2 and the terminal portion N4 are disposed at positions that are axially symmetric with respect to a segment connecting between the middle point of the side a and the middle point of the side c, and in that case, the terminal portion P2 and the terminal portion N4 may be disposed at positions each being offset from the middle of a corresponding one of the sides b, d, i.e. not in the middles of the sides b, d as opposed to FIG. 2. Further, as long as at least the terminal portions P2, N4 and the terminal portions N1, P4 are disposed at positions that are axially symmetric with respect to L11 and L12 in FIG. 6, respectively, the other terminal portions P formed by the first lead frame 11 and the other terminal portions N formed by the second lead frame 12 are not necessarily disposed at axially symmetric positions.

Figure 7:
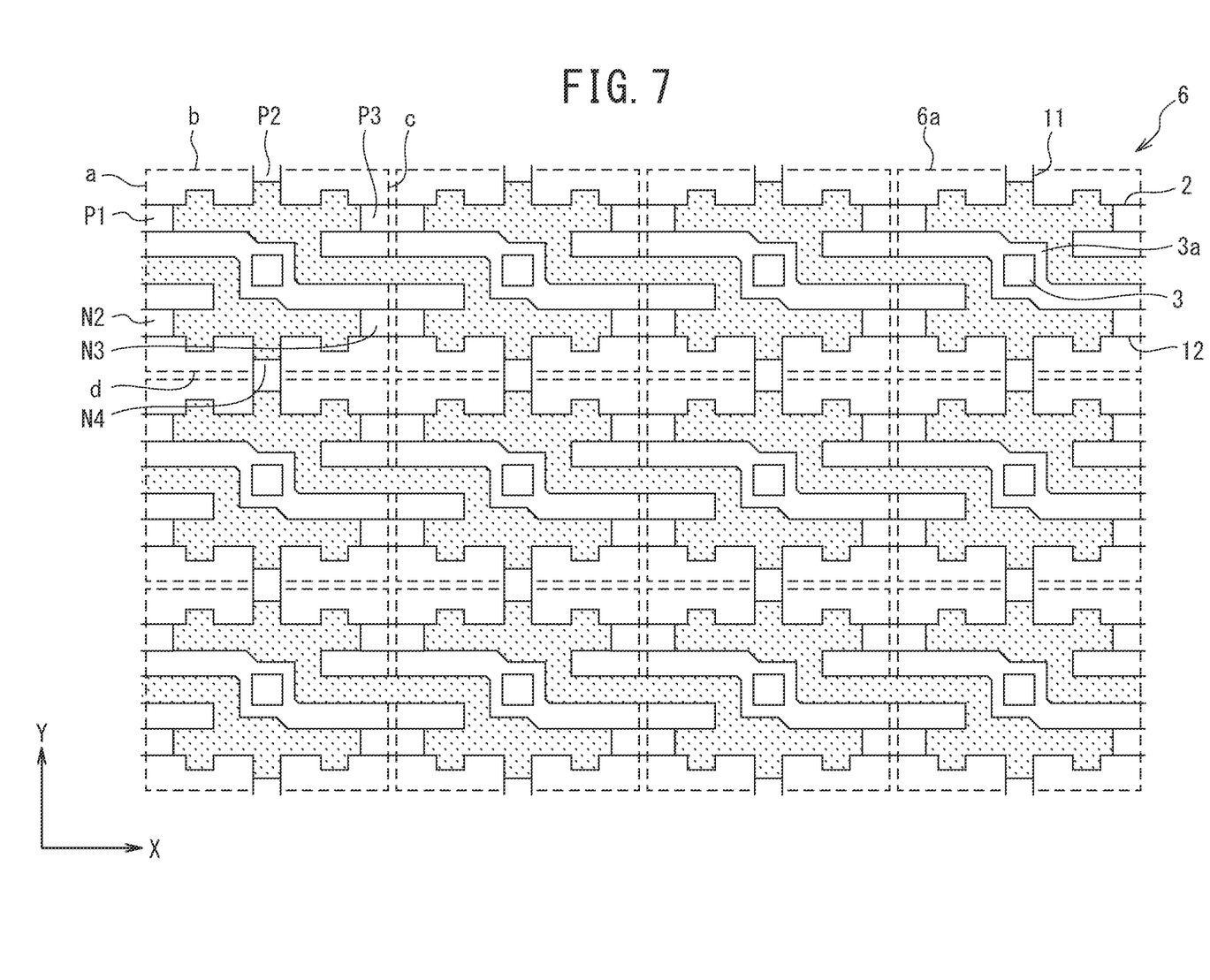
FIG. 7 is a plan view illustrating another example of a lead frame substrate.
Figure 8A:
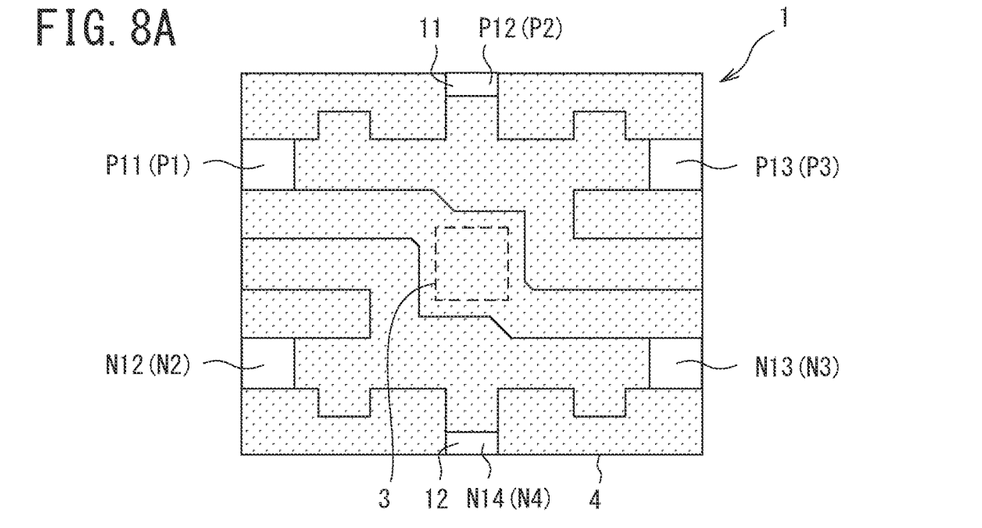
Figure 8B:
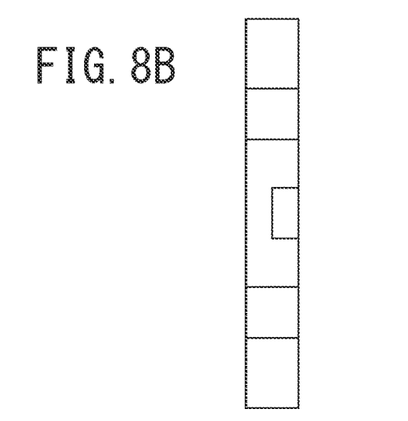
Figure 8C:
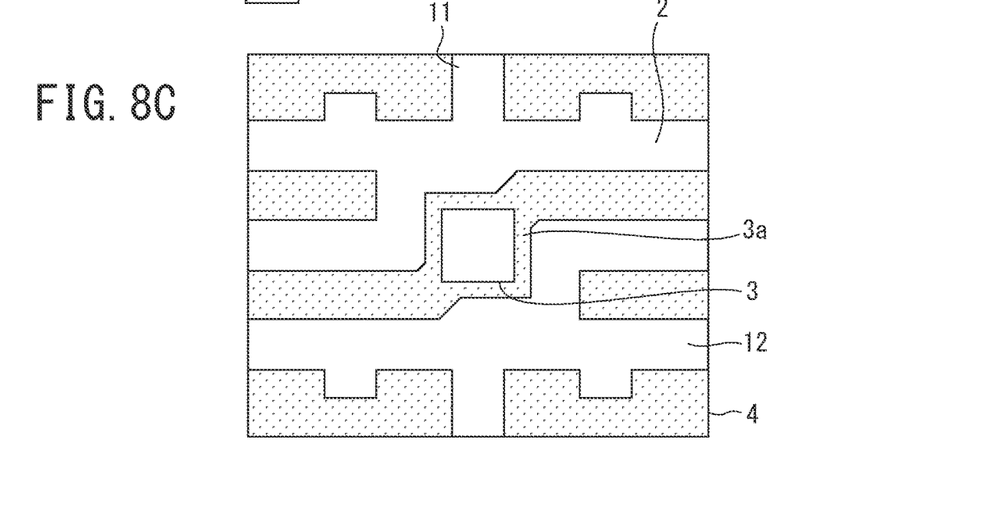

Further, referring to the example of the terminal portions N1, P4 in FIG. 2, assuming that sufficient mounting strength is obtained with the presence of the terminal portions P1, N2 and the terminal portions P3, N3, the terminal portions N1, P4 may be in a thin plate state of being less in thickness than the other terminal portions as illustrated in FIG. 7. In FIG. 7, hatched portions indicate a thin plate state. As one example of manufacturing a semiconductor element using a lead frame substrate illustrated in FIG. 7, a bottom view is illustrated in FIG. 8A, a side view is illustrated in FIG. 8B, and a plan view is illustrated in FIG. 8C. In the bottom view of FIG. 8A and the plan view of FIG. 8C, a hatched portion indicates a sealing portion 4 as in FIG. 3. In FIG. 8A, portions covered by the sealing portion 4 are also drawn by a solid line.

As illustrated in FIGS. 7 and 8A, terminal portions P1 to P3 formed by a first lead frame 11 are exposed from the sealing portion 4 to serve as connection terminals P11 to P13, and terminal portions N2 to N4 formed by a second lead frame 12 are exposed from the sealing portion 4 to serve as connection terminals N12 to N14.

While the embodiments of the present invention have been described hereinabove, the above-described embodiments describe, by way of example, devices and methods for embodying the technical idea of the present invention, and the technical idea of the present invention does not specify the materials, shapes, structures, arrangements, and so on of constituent components. The technical idea of the present invention can be variously modified within the technical scope defined by the claims.

DESCRIPTION OF REFERENCE SYMBOLS 1 semiconductor element
2 lead frame
3 IR chip
4 sealing portion
5 wire
6 lead frame substrate
P1 to P4 terminal portions
P11 to P14 connection terminals
N1 to N4 terminal portions
N11 to N14 connection terminals

What is claimed is:

1. A semiconductor element comprising:
   a semiconductor substrate;
   a compound semiconductor layer formed on the semiconductor substrate and including a first conductivity type semiconductor layer, an active layer, and a second conductivity type semiconductor layer;
   a first electrode electrically connected to the first conductivity type semiconductor layer;
   a second electrode electrically connected to the second conductivity type semiconductor layer;
   a first lead frame electrically connected to the first electrode;
   a second lead frame electrically connected to the second electrode; and
   a sealing portion integrally sealing the semiconductor substrate, the compound semiconductor layer, the first electrode, the second electrode, the first lead frame, and the second lead frame,
   the semiconductor element having a shape of a rectangular parallelepiped and having a photoelectric conversion function or an electro-optical conversion function,
   wherein:
   on four sides forming one surface of the rectangular parallelepiped in plan view, portions of at least one of the first lead frame and the second lead frame are respectively in contact with the four sides and are exposed from the sealing portion to serve as connection terminals; and
   in each of two pairs each including the two sides, facing each other, of the four sides, the portion of the first lead frame is in contact with one of the two sides and is exposed as the connection terminal, the portion of the second lead frame is in contact with the other of the two sides and is exposed as the connection terminal, and the connection terminal being the exposed portion of the first lead frame and the connection terminal being the exposed portion of the second lead frame are disposed at positions being axially symmetric with each other.

2. The semiconductor element according to claim 1, wherein the first lead frame includes, as the connection terminals, three terminals being in contact with the three sides, different from each other, of the four sides and being exposed.

3. The semiconductor element according to claim 2, wherein the second lead frame includes, as the connection terminals, two terminals being in contact with the two sides, different from each other, of the four sides and being exposed.

4. The semiconductor element according to claim 2, wherein in each of the two pairs each including the two sides, facing each other, of the four sides, the portion of the first lead frame is in contact with one of the two sides and is exposed at a side surface contacting the one of the two sides, the portion of the second lead frame is in contact with the other of the two sides and is exposed at a side surface contacting the other of the two sides, and the portion, exposed at the side surface, of the first lead frame and the portion, exposed at the side surface, of the second lead frame are disposed at positions being axially symmetric with each other.

5. The semiconductor element according to claim 2, wherein three terminals are provided as the connection terminals on each of the two sides forming one of the two pairs each including the two sides, facing each other, of the four sides, and one terminal is provided as the connection terminal on each of the two sides forming the other of the two pairs.

6. The semiconductor element according to claim 2, wherein at least one of the first lead frame and the second lead frame is present at positions respectively overlapping, in plan view, straight lines each passing through middle points of the two sides, facing each other, of the four sides.

7. The semiconductor element according to claim 2, wherein at least one of the first lead frame and the second lead frame is present at a position overlapping, in plan view, a straight line dividing the one surface into two regions being point-symmetric with each other.

8. The semiconductor element according to claim 1, wherein the second lead frame includes, as the connection terminals, two terminals being in contact with the two sides, different from each other, of the four sides and being exposed.

9. The semiconductor element according to claim 8, wherein in each of the two pairs each including the two sides, facing each other, of the four sides, the portion of the first lead frame is in contact with one of the two sides and is exposed at a side surface contacting the one of the two sides, the portion of the second lead frame is in contact with the other of the two sides and is exposed at a side surface contacting the other of the two sides, and the portion, exposed at the side surface, of the first lead frame and the portion, exposed at the side surface, of the second lead frame are disposed at positions being axially symmetric with each other.

10. The semiconductor element according to claim 8, wherein three terminals are provided as the connection terminals on each of the two sides forming one of the two pairs each including the two sides, facing each other, of the four sides, and one terminal is provided as the connection terminal on each of the two sides forming the other of the two pairs.

11. The semiconductor element according to claim 8, wherein at least one of the first lead frame and the second lead frame is present at positions respectively overlapping, in plan view, straight lines each passing through middle points of the two sides, facing each other, of the four sides.

12. The semiconductor element according to claim 8, wherein at least one of the first lead frame and the second lead frame is present at a position overlapping, in plan view, a straight line dividing the one surface into two regions being point-symmetric with each other.

13. The semiconductor element according to claim 1, wherein in each of the two pairs each including the two sides, facing each other, of the four sides, the portion of the first lead frame is in contact with one of the two sides and is exposed at a side surface contacting the one of the two sides, the portion of the second lead frame is in contact with the other of the two sides and is exposed at a side surface contacting the other of the two sides, and the portion, exposed at the side surface, of the first lead frame and the portion, exposed at the side surface, of the second lead frame are disposed at positions being axially symmetric with each other.

14. The semiconductor element according to claim 13, wherein three terminals are provided as the connection terminals on each of the two sides forming one of the two pairs each including the two sides, facing each other, of the four sides, and one terminal is provided as the connection terminal on each of the two sides forming the other of the two pairs.

15. The semiconductor element according to claim 13, wherein at least one of the first lead frame and the second lead frame is present at positions respectively overlapping, in plan view, straight lines each passing through middle points of the two sides, facing each other, of the four sides.

16. The semiconductor element according to claim 13, wherein at least one of the first lead frame and the second lead frame is present at a position overlapping, in plan view, a straight line dividing the one surface into two regions being point-symmetric with each other.

17. The semiconductor element according to claim 1, wherein three terminals are provided as the connection terminals on each of the two sides forming one of the two pairs each including the two sides, facing each other, of the four sides, and one terminal is provided as the connection terminal on each of the two sides forming the other of the two pairs.

18. The semiconductor element according to claim 17, wherein at least one of the first lead frame and the second lead frame is present at positions respectively overlapping, in plan view, straight lines each passing through middle points of the two sides, facing each other, of the four sides.

19. The semiconductor element according to claim 1, wherein at least one of the first lead frame and the second lead frame is present at positions respectively overlapping, in plan view, straight lines each passing through middle points of the two sides, facing each other, of the four sides.

20. The semiconductor element according to claim 1, wherein at least one of the first lead frame and the second lead frame is present at a position overlapping, in plan view, a straight line dividing the one surface into two regions being point-symmetric with each other.

* * * * *